United States Patent
Osborn et al.

(10) Patent No.: US 6,201,427 B1
(45) Date of Patent: Mar. 13, 2001

(54) CIRCUITRY FOR PROTECTING A N-CHANNEL LOAD DRIVING DEVICE FROM REVERSE VOLTAGE CONDITION

(75) Inventors: Douglas Bruce Osborn; Douglas Joseph Huhmann; Mark Wendell Gose, all of Kokomo, IN (US)

(73) Assignee: Delco Electronics Corporation, Kokomo, IN (US)

( * ) Notice: Subject to any disclaimer, the term of this patent is extended or adjusted under 35 U.S.C. 154(b) by 0 days.

(21) Appl. No.: 09/236,747

(22) Filed: Jan. 25, 1999

(51) Int. Cl.[7] ........................................ H03K 5/00
(52) U.S. Cl. ........................... 327/310; 327/324; 361/56
(58) Field of Search .................................. 327/310, 313, 327/314, 318–320, 324, 325, 327, 328; 361/56, 91

(56) References Cited

U.S. PATENT DOCUMENTS

| | | | |
|---|---|---|---|
| 5,455,732 | * 10/1995 | Davis | 361/90 |
| 5,654,858 | * 8/1997 | Martin et al. | 361/56 |
| 5,764,088 | * 6/1998 | Laieville et al. | 327/110 |
| 5,963,407 | * 10/1999 | Fragapane et al. | 361/42 |

* cited by examiner

*Primary Examiner*—Kenneth B. Wells
(74) *Attorney, Agent, or Firm*—Jimmy L. Funke

(57) ABSTRACT

The invention relates to circuitry for protecting n-channel load driving devices from reverse voltage conditions and for inhibiting the flow of destructive currents through such devices under reverse voltage conditions. According to one embodiment of the invention, a circuit is provided for protecting an n-channel high side load driving device from negative battery and negative transient operating conditions.

12 Claims, 3 Drawing Sheets

CIRCUITRY FOR PROTECTING A N-CHANNEL LOAD DRIVING DEVICE FROM REVERSE VOLTAGE CONDITION

FIELD OF THE INVENTION

The present invention relates generally to circuitry for protecting n-channel load driving devices from reverse voltage conditions, and more specifically to such circuitry for inhibiting the flow of destructive currents through such devices under reverse voltage conditions.

BACKGROUND OF THE INVENTION

Integrated circuits are often used for driving loads in a variety of applications including those in the automotive environment. Such automotive loads may include dashboard lights, fuel injectors, solenoids, motors and the like. To provide the maximum voltage across such loads, the loads or load driving circuitry are typically tied directly to the vehicle battery.

Integrated circuits that drive these automotive loads fall into two broad categories; low side drivers and high side drivers. Referring to FIG. 1, a prior art example of a low side driver circuit 10 is illustrated. Circuit 10 includes a load driving device 12, illustrated in FIG. 1 as a metal-oxide-semiconductor field effect transistor (MOSFET), having a control input or gate receiving a gate drive signal GD, an output or source connected to ground potential or VSS, and a signal input or drain connected to one end of a load 14. The opposite end of load 14 is connected to battery voltage $V_{BAT}$. Within circuit 10, load driving device 12 is responsive to the gate drive signal GD to conduct a load current $I_L$ from $V_{BAT}$ through load 14, and through device 12 to ground potential VSS.

Referring to FIG. 2, a prior art example of a high side driver circuit 20 is illustrated. High side driver circuit 20 includes a load driving device 12, illustrated in FIG. 2 as a MOSFET, including a control input or gate receiving a gate drive signal GD, a signal input or drain receiving a battery voltage $V_{BAT}$ and an output or source connected to one end of a load 14. The opposite end of load 14 is connected to ground potential or VSS. In operation, load driving device 12 is responsive to the gate drive signal GD to conduct current from $V_{BAT}$, from the drain to the source of device 12, through load 14 and to ground potential VSS.

In either of these circuit configurations 10 or 20 shown in FIGS. 1 and 2, the load driving device 12 is typically an N-channel MOSFET having a low voltage drop from drain to source when activated. Within circuits 10 and 20 of FIGS. 1 and 2, the load driving device 12 is illustrated as a double diffusion metal-oxide-semiconductor, or DMOS, transistor wherein the structure of one known configuration of a DMOS transistor 12 is shown in cross section in FIG. 3. Referring to FIG. 3, the N channel DMOS transistor 12 includes a substrate 30, typically formed from a P- semiconductor material in which a n-type buried layer silicon material 32 is formed. A n-type epitaxial layer 34 is typically grown or otherwise deposited on top of the substrate 30 and buried layer 32 combination, and a p-type isolation region 36 is diffused or otherwise implanted about a portion of layer 34 and extends into substrate 30 to thereby define a n-type silicon pocket 34'. A p+ layer 38 is typically diffused or otherwise implanted into a portion of the isolation region 36 to thereby form a low resistance contact for metal layer 40 which is typically tied to ground potential or VSS.

Within n-type pocket 34', a deep N+ (DN+) region 42 is diffused or otherwise implanted into n-type pocket 34' and extends into the buried layer 32 to thereby form a low resistance path through pocket 34' to the buried layer 32. A n+ silicon layer is diffused or otherwise implanted into DN+ layer 42 to thereby form an ohmic contact to metal layer 46 which defines the drain of the n-channel MOSFET. A p-type silicon layer 50 is diffused or otherwise implanted into n-type pocket 34' and a p+ silicon layer 54 is diffused or otherwise implanted into p-type layer 50 to thereby provide an ohmic contact to a metal layer 56 which defines the source of MOSFET 12. A n+ silicon layer 52 is diffused or otherwise implanted into p-type layer 50 about p+ region 54 and an oxide gate 58 is grown or otherwise deposited over p-type layer 50 and overlapping n+ layer 52 and n-type pocket 34'. A polysilicon layer 60 is formed over gate oxide 58 and defines the gate of MOSFET 12. An oxide layer 48, typically silicon dioxide ($SiO_2$) or silicon nitride ($SiN_3$), is formed over the bare silicon regions to thereby protect device 12 and insulate the silicon layers from the metal layers 40, 46, 56 and polysilicon layer 60. In the operation of MOSFET 12, a suitable gate voltage GD applied to gate 60 which forms a n-type depletion layer near the surface of p-type region 50 between n+ region 52 and n-type pocket 34' to thereby provide a current conduction path between drain 46 and source 56, as is known in the art.

In the typical structure of the n-channel MOSFET 12 illustrated in FIG. 3, two current conduction paths are formed that are separate from the operation of the MOSFET 12 as just described. A first current conduction path is formed between p-type region 50 and n-type pocket 34' and defines a so-called body diode between source 56 and drain 46 as illustrated by diode Z1 in FIGS. 1 and 2, wherein diode Z1 is operable to conduct a current $I_{Z1}$ from source 56 to drain 46 under certain negative battery or negative transient operating conditions as will be described in greater detail hereinafter. A second current conduction path is defined between isolation region 36 and n-type pocket 34' and defines a second diode illustrated in FIGS. 1 and 2 as diode Z2, wherein diode Z2 is operable to conduct a current $I_{Z2}$ from VSS 40 to the drain 46 of MOSFET 12 under certain negative battery or negative transient operating conditions as will be described in greater detail hereinafter.

The automotive environment offers many challenges when driving loads directly from the battery, including a reverse battery condition (e.g. −13.5 volts) and negative transients due to inductive switching of loads elsewhere in the vehicle. When using a n-channel MOSFET device such as device 12, diodes Z1 and Z2 are operable to conduct currents $I_{Z1}$ and $I_{Z2}$ respectively when this negative voltage is applied to the battery line. In the low side driver configuration illustrated in FIG. 1, the negative battery condition or other negative transients generally do not cause a catastrophic problem since the currents $I_{Z1}$ and $I_{Z2}$ flowing from VSS to $V_{BAT}$ are limited by the internal impedance of load 14. This current limiting function of load 14 is typically sufficient to protect MOSFET 12 from damage or destruction in the low side driver configuration of FIG. 1.

In the high side driver configuration illustrated in FIG. 2, however, the drain of the MOSFET 12 is coupled directly to ground potential VSS via diode Z2, wherein the drain of MOSFET 12 is connected directly to $V_{BAT}$. Thus, under negative battery conditions or other negative transients, while current $I_{Z1}$ is limited by the internal impedance of load 14, the current $I_{Z2}$ is limited only by the impedance of diode Z2 which is typically very small. With such little resistance from VSS to $V_{BAT}$ through diode Z2, the value of $I_{Z2}$ may accordingly become excessively large and potentially destructive. As a result of large $I_{Z2}$ current values, MOSFET 12 may latch up, the bond wires to the integrated circuit may become fused open, electromigration of the metal layers in the vicinity of device 12 may occur, and/or heat generated by the conduction of $I_{Z2}$ may become excessive and damage or otherwise destroy the silicon. In any event, allowing the substantially unlimited current $I_{Z2}$ to flow under negative battery or negative transient conditions could result in catastrophic damage to MOSFET 12 and surrounding circuitry.

At least three techniques for addressing the foregoing problems associated with negative battery and negative transient conditions in a n-channel MOSFET are known. According to one known technique, MOSFET 12 may be physically separated from the control circuitry controlling device 12 so that device 12 does not share an isolation region 36 in common with that of the control circuit generating the gate drive signal GD. This technique eliminates diode Z2 but requires partitioning MOSFET 12 and any control circuitry into separate integrated circuits which may be cost prohibitive.

According to a second known technique for addressing the above problem, a PNP bipolar transistor may be used to replace MOSFET 12 in the high side driver circuit 20 of FIG. 2. This technique eliminates any current flow back to the $V_{BAT}$ terminal under negative battery conditions, but is expensive at the integrated circuit level since the area required for a PNP transistor is much larger than that required by MOSFET 12 for the same performance. The PNP transistor also has a large base current that would be pulled from the $V_{BAT}$ line under normal operating conditions, thereby resulting in undesirable power dissipation and large quiescent currents.

A third known technique for addressing the above problem is to use a blocking diode between $V_{BAT}$ and the drain of MOSFET 12 to thereby block reverse current flow from the drain of MOSFET 12 to $V_{BAT}$ under reverse battery or negative transient conditions. Such blocking diodes, however, typically consume substantial circuit or circuit board space when sized large enough to handle the reverse voltage conditions as well as the load currents present during normal battery conditions. Moreover, the blocking diode creates a voltage drop in series with the load 14 that undesirably dissipates power and reduces the voltage across the load 14.

In an integrated circuit of the type illustrated in FIG. 3, the potential of isolation region 36 is preferably connected to the lowest potential on the integrated circuit in order to be effective as a device isolator on the circuit. Accordingly, isolation region 36 has been typically connected in the past to ground potential or VSS. Unfortunately, this common practice results in the potentially destructive flow of current $I_{Z2}$ through diode z2 under negative battery or negative transient operating conditions in the high side driver configuration 20 illustrated in FIG. 2 as just described. What is therefore needed is a technique for addressing the problems associated with diode Z2 described hereinabove while also maintaining isolation region 36 at or near the lowest potential on the integrated circuit. By eliminating the potentially destructive current $I_{Z2}$ and further providing for the connection of isolation region 36 to the lowest potential on the integrated circuit, such a technique would be ideally suited for applications wherein it would be desirable to form one or more MOSFETS 12 on the same integrated circuit as that of the control circuitry.

SUMMARY OF THE INVENTION

The foregoing shortcomings of the prior art are addressed by the present invention. In accordance with one aspect of the present invention, circuitry for protecting a load driving device from a reverse voltage condition comprises a current drive device fabricated within a n-type silicon region formed on a p-type silicon substrate and surrounded by a p-type isolation region extending into the substrate, the n-type silicon region defining a drain of the drive device, a first protection device connected between the isolation region and a reference node, and a second protection device connected between the isolation region and the drain of the drive device. The first protection device isolates the isolation region from the reference node and the second protection device couples the isolation region to the drain of the drive device when a first voltage defined at the drain of the drive device is negative with respect to a reference potential defined at the reference node. The first protection device couples the isolation region to the reference node and the second protection device isolates the isolation region from the drain of the drive device when the first voltage is positive with respect to the reference potential.

One object of the present invention is to provide an improved circuit technique for protecting a n-channel high side load driving device from negative battery and negative transient operating conditions.

These and other objects of the present invention will become more apparent from the following description of the preferred embodiment.

DESCRIPTION OF THE PREFERRED EMBODIMENT

Figure 1:
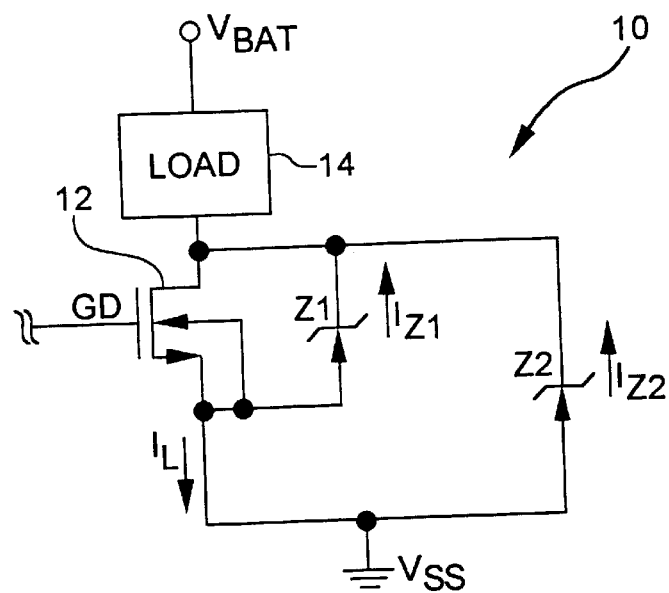
FIG. 1 is a schematic diagram illustrating a prior art low side driver circuit utilizing a n-channel load driving device.

For the purposes of promoting an understanding of the principles of the invention, references will now be made to the embodiment illustrated in the drawings and specific language will be used to describe the same. It will nevertheless be understood that no limitation of the scope of the invention is thereby intended, such alterations and further modifications in the illustrated device, and such further application of the principles of the invention as illustrated therein being contemplated as would normally occur to one skilled in the art to which the invention relates.

Figure 2:
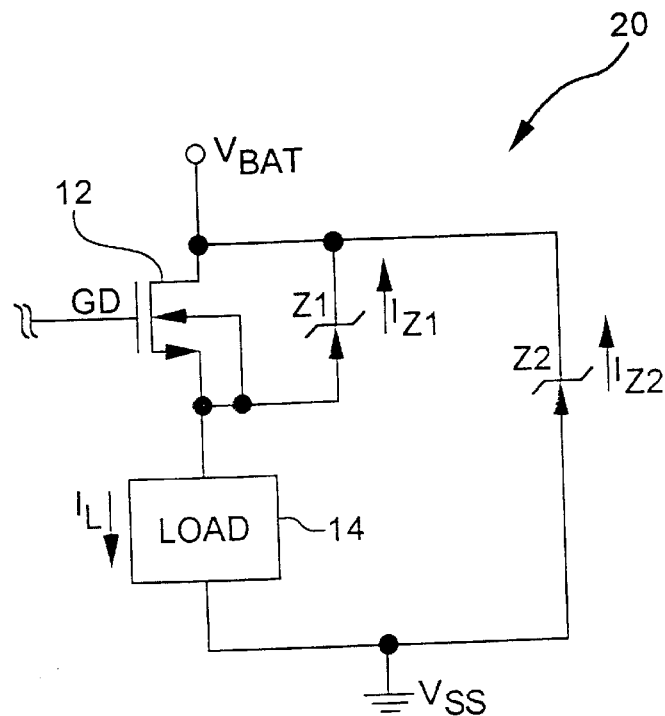
FIG. 2 is a schematic diagram illustrating a prior art high side driver circuit utilizing a n-channel load driving device.
Figure 3:
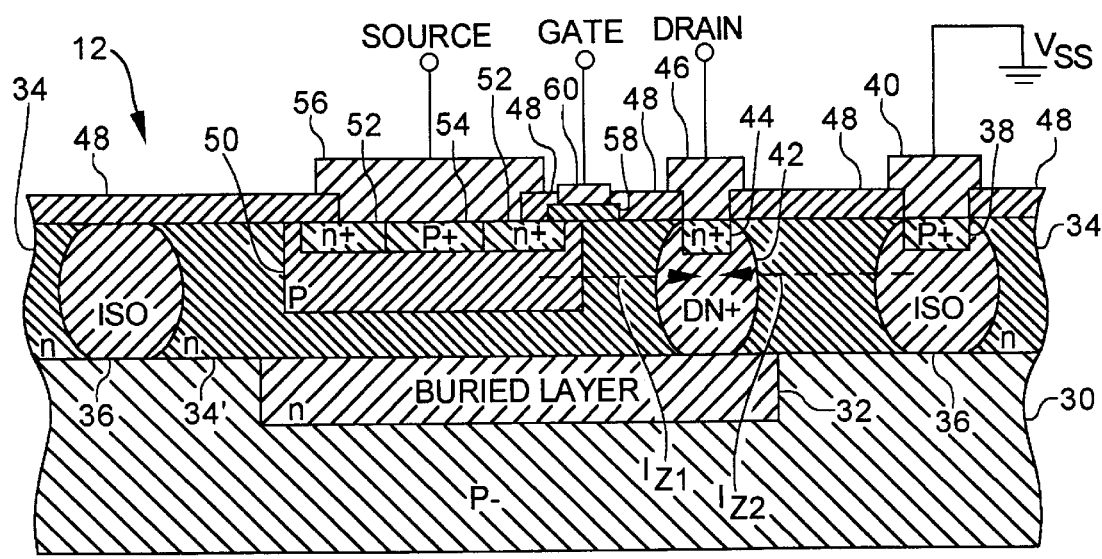
FIG. 3 is a cross-sectional diagram illustrating one known structure of a prior art n-channel load driving device of the type illustrated in FIGS. 1 and 2.
Figure 4:
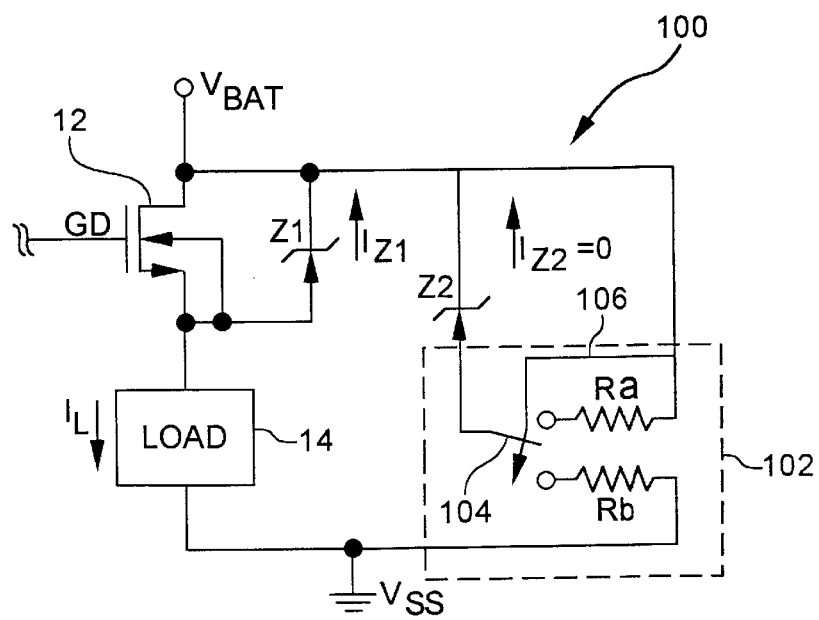
FIG. 4 is a schematic diagram of a high side driver circuit illustrating circuitry for eliminating destructive current flow in a n-channel load driving device under negative battery or negative transient conditions, in accordance with the present invention.

Referring now to FIG. 4, a simplified schematic of a high side driver circuit 100 including circuitry for eliminating the flow of current from VSS to $V_{BAT}$ under negative battery or negative transient conditions, in accordance with the present invention, is shown. High side driver circuit 100 includes a n-channel MOSFET device 12 connected between battery voltage $V_{BAT}$ and a load 14, wherein device 12, load 14 and $V_{BAT}$ are all connected as described with respect to FIG. 2 and wherein load 14 is connected to ground potential or VSS. Some of the various regions of device 12 (including diodes z1 and z2), as they relate to the integrated circuit structure of device 12 illustrated and described with respect to FIG. 3, are correspondingly numbered parenthetically in FIG. 5 for cross-reference. In any event, unlike circuit 12 of FIG. 2, the anode of diode Z2 in circuit 100 is not connected to VSS directly but is rather switchable between $V_{BAT}$ and VSS through low resistance paths illustrated symbolically by resistors Ra and Rb respectively. Specifically, the circuitry 102 of the present invention includes a switch 104 connected to the anode of Z2, wherein activation of the switch 104 is controlled by the voltage polarity of $V_{BAT}$ with respect to VSS as shown schematically by signal line 106. If $V_{BAT}$ is negative with respect to VSS, switch 104 is connected to low resistance path Ra to thereby pull the anode of diode Z2 (isolation region 36 of FIG. 3) near $V_{BAT}$. If, on the other hand, $V_{BAT}$ is positive with respect to VSS, switch 104 is connected to low resistance path Rb to thereby pull the anode of diode Z2 (isolation region 36 of FIG. 3) to a potential near VSS. It is to be understood that $V_{BAT}$ is, in one embodiment, representative of the battery voltage of an automotive battery (not shown), but may alternatively be any voltage supply.

Figure 5:
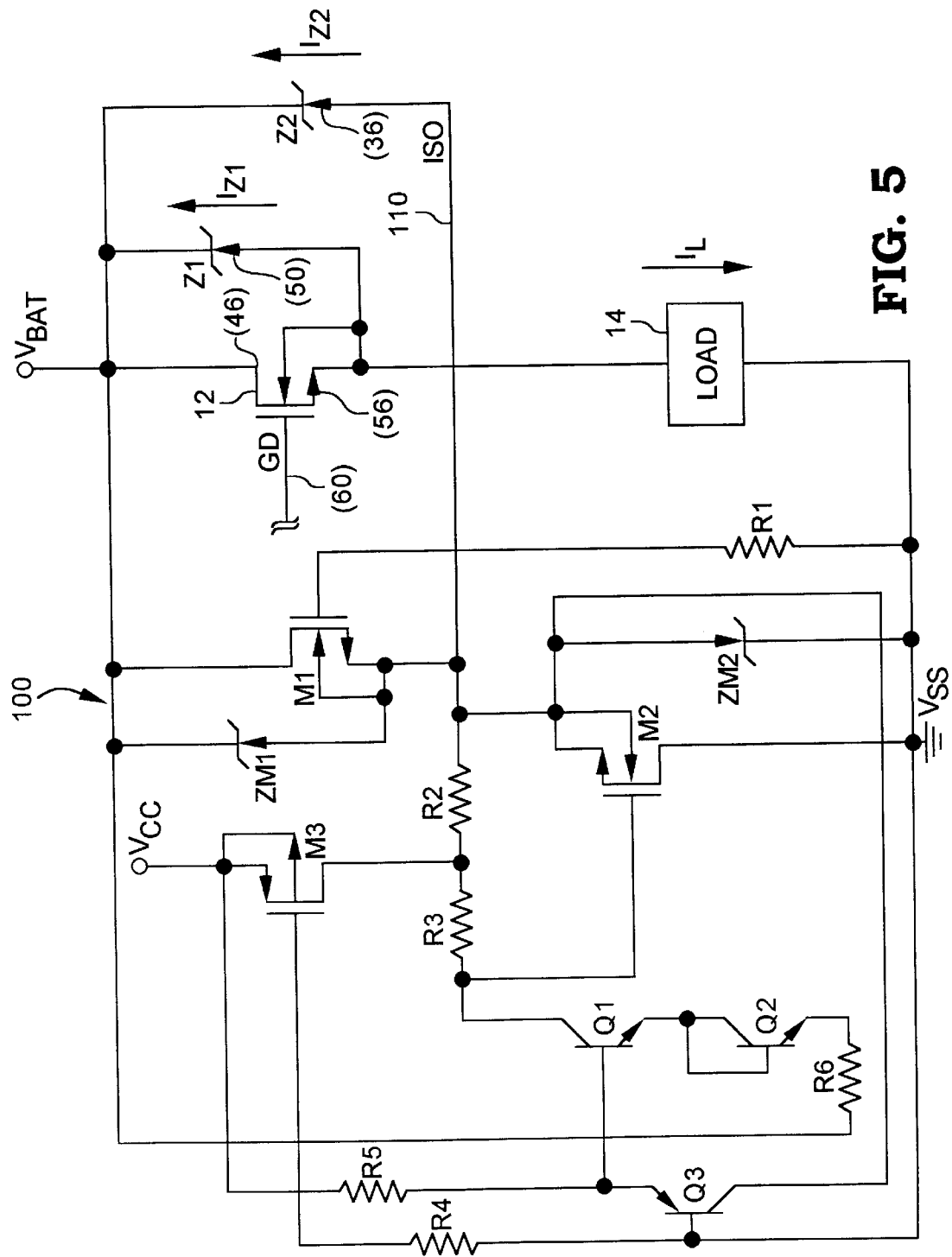
FIG. 5 is a detailed schematic illustrating one preferred embodiment of the circuitry of FIG. 4 for eliminating destructive current flow in a n-channel load driving device under negative battery or negative transient operating conditions, in accordance with the present invention.

Referring now to FIG. 5, one preferred embodiment of the high side driver circuit 100 of FIG. 4, in accordance with the present invention, is shown. Circuit 100 of FIG. 5 includes the n-channel load driving device 12 having a drain connected battery voltage $V_{BAT}$, a gate responsive to a gate drive voltage GD to activate device 12 as described hereinabove and a source connected to one end of a load 14. The opposite end of load 14 is connected to a reference potential VSS which is preferably at ground potential. It is to be understood, however, that VSS may be a potential other than ground potential. The n-channel load driving device 12 includes body diode Z1 defined between the source and drain of device 12 as described with respect to FIG. 3, and further includes diode Z2 defined between an isolation region (such as isolation region 36 of FIG. 3) and the drain of device 12 as also described with respect to FIG. 3. Unlike FIG. 3, however, the isolation region of device 12 within circuit 100 is not directly connected to VSS but is rather connected via signal line 110 to the source of a n-channel transistor M1, the source of a n-channel transistor M2 and one end of a resistor R2. The gate of M1 is connected to one end of a resistor R1, the opposite end of which is connected to VSS. The drain of M1 is connected to $V_{BAT}$. M1 includes a body diode, identical to body diode Z1 of device 12, having an anode connected to the source of M1 and a cathode connected to the drain of M1. The drain of M2 is connected to VSS, and transistor M2 includes a body diode ZM2, identical to diode Z1 of device 12, having an anode connected to the source of M2 and a cathode connected to the drain of M2. The gate of transistor M2 is connected to one end of a resistor R3 and the collector of a NPN transistor Q1. The opposite ends of R2 and R3 are both connected to the drain of a p-channel transistor M3, the source of which is connected to a voltage VCC. VCC is, in one embodiment, less than $V_{BAT}$ wherein typical values for $V_{BAT}$ may range between approximately −12 to −15 volts (reverse battery condition) and approximately +12 to +15 volts (normal battery condition), and VCC is typically in the range of 5 volts. The source of transistor M3 is further connected to one end of a resistor R5, the opposite end of which is connected to the base of Q1 and the emitter of a PNP transistor Q3. The gate of transistor M3 is connected to one end of a resistor R4, the opposite end of which is connected to the base of transistor Q3 and to VSS. The emitter of Q1 is connected to the anode of a diode, the cathode of which is connected to one end of a resistor R6. In one embodiment, the anode of the diode is defined by the connection of a base and collector of a NPN transistor Q2, and the cathode is defined by the emitter of Q2. In any case, the opposite end of resistor R6 is connected to $V_{BAT}$ In the operation of circuit 100, transistor M2 is operable to pull the isolation region defining the anode of diode Z2 near VSS when $V_{BAT}$ is positive with respect to VSS, and transistor M1 is operable under such conditions to isolate the anode of diode Z2 from $V_{BAT}$. When $V_{BAT}$ is negative with respect to VSS, transistor M1 is operable to pull the isolation region defining the anode of Z2 near $V_{BAT}$ while transistor M2 is operable to isolate the isolation region defining the anode of Z2 from VSS.

When circuit 100 is without power, isolation line 110 is held near VSS via the body diode ZM2 of transistor M2. Under normal power up conditions, a positive $V_{BAT}$ is applied followed by application of VCC. As VCC approaches a gate-to-source threshold voltage (Vgs) of transistor M3, M3 will turn on supplying gate drive to transistor M2 through resistor R3. Transistor M2 is responsive to this gate drive signal to turn on and pull the isolation line 110 near VSS through the low impedance path of activated M2.

Transistors Q1, Q2 and Q3 are used to monitor the voltage on the drain of device 12 ($V_{BAT}$). With $V_{BAT}$ at a positive potential, transistors Q1 and Q2 are turned off and transistor Q3 is turned on, thereby sinking the current supplied through R5 from VCC. With the base of Q3 connected to VSS, the emitter of Q3 and the base of Q1 are held one base-emitter voltage (Vbe) above VSS. When $V_{BAT}$ goes negative one Vbe below VSS, Q1 and Q2 are turned on thereby pulling gate drive away from transistor M2. Transistor M2 accordingly turns off which removes the low impedance path from isolation line 110 to VSS and minimizes any current flow in diode Z2. Isolation line 110 is, under such conditions, pulled near $V_{BAT}$ through body diode ZM1. As $V_{BAT}$ continues decreasing and approaches a Vgs threshold voltage below the gate of transistor M1, M1 turns on and pulls the isolation line 110 near $V_{BAT}$ through a low impedance path defined through the activated M1. With isolation line 110 approximately at the same potential $V_{BAT}$, no current flows through Z2 or ZM1. Transistor M1 is thereafter operable to regulate the isolation line 110 to near $V_{BAT}$ as long as $V_{BAT}$ is negative.

If $V_{BAT}$ starts increasing towards zero, transistor M1 keeps isolation line 110 near $V_{BAT}$ until $V_{BAT}$ is a Vgs threshold below VSS. Diode ZM1 and Z2 keep isolation line 110 near $V_{BAT}$ under such conditions. As $V_{BAT}$ returns to 1 diode drop, or one Vbe, below VSS, transistors Q1 and Q2 turn off and the gate drive supplied by transistor M3 is thereby directed to the gate of transistor M2. As a result, transistor M2 turns on and pulls isolation line 110 near VSS through the low impedance path defined therethrough.

If a reverse battery condition occurs with no VCC applied, transistor M2 is turned off since transistor M3 is not supplying gate drive thereto. In this case, isolation line 110 would be coupled to $V_{BAT}$ through diodes ZM1 and Z2 until transistor M2 is enabled as described above.

From the foregoing it should be appreciated that the present invention provides for the protection of a n-channel MOSFET under negative battery and/or negative transient operating conditions, particularly when connected in a high-side driver configuration, while avoiding the various drawbacks of the prior art protection circuits described in the BACKGROUND section. By eliminating the possibility of large current flow through diode z2, the present invention also allows one or more n-channel MOSFETs and control circuitry therefore to be fabricated on the same integrated circuit without risking catastrophic damage to any of the circuitry due to negative battery and/or negative transient operating conditions. Moreover, the present invention is effective in maintaining the potential of the isolation region defining the anode of diode Z2 near the most negative potential on circuit 100 for optimal device isolation while establishing a high impedance between VSS and $V_{BAT}$ under negative battery and/or negative transient operating conditions.

While the invention has been illustrated and described in detail in the foregoing drawings and description, the same is to be considered as illustrative and not restrictive in character, it being understood that only the preferred embodiment has been shown and described and that all changes and modifications that come within the spirit of the invention are desired to be protected.

What is claimed is:

1. Circuitry for protecting a load driving device from a reverse voltage condition, comprising:

a current drive device fabricated within a n-type silicon region formed on a p-type silicon substrate and surrounded by a p-type isolation region extending into said substrate, said n-type silicon region defining a drain of said drive device;

a first protection device connected between said isolation region and a reference node; and a second protection device connected between said isolation region and said drain of said drive device, said first protection device isolating said isolation region from said reference node and said second protection device coupling said isolation region to said drain of said drive device when a first voltage defined at said drain of said drive device is negative with respect to a reference potential defined at said reference node, said first protection device coupling said isolation region to said reference node and said second protection device isolating said isolation region from said drain of said drive device when said first voltage is positive with respect to said reference potential.

2. The circuitry of claim 1 wherein said load driving device, said first protection device and said second protection device are n-channel metal-oxide-semiconductor field effect (MOSFET) transistors.

3. The circuitry of claim 1 wherein said first protection device includes a source connected to said isolation region, a drain connected to said reference node, a gate responsive to a first control signal for conducting current through said first protection device to thereby couple said isolation region to said reference node and a first body diode having an anode defined by said source of said first protection device and a cathode defined by said drain of said first protection device, said first body diode coupling said isolation region to said reference node in the absence of said first control signal when said first voltage is positive with respect to said reference potential.

4. The circuitry of claim 3 further including a third protection device having a signal input, a control input coupled to said reference node and an output coupled to said gate of said first protection device, said third protection device responsive to a second voltage defined at said signal input of said third protection device greater than a first threshold voltage above a voltage defined at said control input of said third protection device to produce said first control signal.

5. The circuitry of claim 4 wherein said third protection device is a p-channel MOSFET transistor having a source defining said signal input, a gate defining said control input and a drain defining said output of said third protection device.

6. The circuitry of claim 5 wherein said first threshold voltage is gate-to-source threshold voltage of said p-channel MOSFET transistor.

7. The circuitry of claim 4 wherein said second protection device includes a source connected to said isolation region, a drain connected to said drain of said drive device, a gate coupled to said reference node and a second body diode having an anode defined by said source of said second protection device and a cathode defined by said drain of said second protection device, said second body diode coupling said isolation region to said drain of said drive device when said first voltage is negative with respect to said reference potential while said isolation region is less than a gate-source threshold voltage of said second protection device below said reference potential.

8. The circuitry of claim 7 wherein said second protection device is operable to conduct current from said source to said drain to thereby couple said isolation region to said drain of said drive device when said first voltage is negative and said isolation region is greater than said gate-source threshold voltage of said second protection device below said reference potential.

9. The circuitry of claim 8 further including:

a fourth protection device having a signal input connected to said gate of said first protection device, a control input and an output;

a protection diode having an anode connected to said output of said fourth protection device and a cathode coupled to said drain of said drive device; and a fifth protection device having a signal input connected to said control input of said fourth protection device and coupled to said signal input of said third protection device, a control input connected to said reference node and an output connected to said isolation region, said fifth protection device maintaining said fourth protection device and said protection diode in non-conducting states when said first voltage is positive with respect to said reference potential, said fifth protection device activating said fourth protection device to conduct current through said fourth protection device and said protection diode and away from said gate of said first protection device to thereby deactivate said first protection device when said first voltage drops below a second threshold voltage below said reference potential.

10. The circuitry of claim 9 wherein said fourth protection device is a NPN transistor having a collector defining said signal input, a base defining said control input and an emitter defining said output of said fourth protection device;

and wherein said fifth protection device is a PNP transistor having an emitter defining said signal input, a base defining said control input and a collector defining said output of said fifth protection device.

11. The circuitry of claim 10 wherein said protection diode is a NPN transistor having a collector connected to a base thereof and defining said anode of said protection diode, and an emitter defining said cathode of said protection diode.

12. The circuitry of claim 10 wherein said second threshold voltage is a base-emitter threshold voltage of said NPN transistor protection diode.

* * * * *